(12) United States Patent
Tseng et al.

(10) Patent No.: US 9,913,418 B2
(45) Date of Patent: Mar. 6, 2018

(54) PROCESS OF AN EMBEDDED COMPONENT STRUCTURE

(71) Applicant: Unimicron Technology Corp., Taoyuan (TW)

(72) Inventors: Tzyy-Jang Tseng, Hsinchu (TW); Wei-Ming Cheng, Kaohsiung (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 15/152,564

(22) Filed: May 12, 2016

(65) Prior Publication Data

US 2016/0255751 A1    Sep. 1, 2016

Related U.S. Application Data

(62) Division of application No. 14/255,971, filed on Apr. 18, 2014, now Pat. No. 9,370,107.

(51) Int. Cl.
*H05K 13/04*     (2006.01)
*H05K 1/11*      (2006.01)
(Continued)

(52) U.S. Cl.
CPC ............... *H05K 13/04* (2013.01); *H05K 1/11* (2013.01); *H05K 1/114* (2013.01); *H05K 1/184* (2013.01);
(Continued)

(58) Field of Classification Search
CPC . H05K 13/04; H05K 1/18; H05K 1/11; H05K 3/28; H05K 3/007; H05K 3/187; H05K 3/20; H05K 3/4682
(Continued)

(56) References Cited

U.S. PATENT DOCUMENTS 6,140,144 A  * 10/2000 Najafi ................. B81C 1/00269
                                                    438/106
8,900,931 B2 * 12/2014 Liang ..................... B81B 7/0077
                                                    257/737
(Continued)

FOREIGN PATENT DOCUMENTS

CN          103426836       12/2013

OTHER PUBLICATIONS

"Office Action of China Counterpart Application," dated Jun. 2, 2017, p. 1-p. 8.

*Primary Examiner* — Timothy Thompson
*Assistant Examiner* — Michael F McAllister
(74) *Attorney, Agent, or Firm* — JCIPRNET

(57) ABSTRACT

A wiring board is provided, wherein electrical function of the wiring board is normal, the wiring board has a front side, a reverse side opposite to the front side, an opening and an interconnection layer, the opening penetrates the wiring board and connects the front side and the reverse side, and the interconnection layer is located on the front side and extends toward the opening. A component is bonded to the wiring board, wherein electrical function of the component is normal, the component has an active surface, a back surface opposite to the active surface, and a working area located on the active surface, the active surface is bonded to the interconnection layer, the component is located in the opening, and the active surface and the front side of the wiring board face in a same direction. An encapsulant is filled into the opening, so as to cover the component and expose the working area.

5 Claims, 3 Drawing Sheets

(51) Int. Cl.
    *H05K 1/18*         (2006.01)
    *H05K 3/28*         (2006.01)

(52) U.S. Cl.
    CPC ............ *H05K 1/186* (2013.01); *H05K 3/284* (2013.01); *H05K 1/183* (2013.01); *H05K 2201/09072* (2013.01); *H05K 2201/10083* (2013.01); *H05K 2201/10121* (2013.01); *H05K 2201/10151* (2013.01)

(58) Field of Classification Search
    USPC ............................. 257/432, 433; 250/208.1
    See application file for complete search history.

(56) References Cited

U.S. PATENT DOCUMENTS

| | | | |
|---|---|---|---|
| 2005/0189635 A1* | 9/2005 | Humpston | ............ B81B 7/0077 257/678 |
| 2008/0017940 A1* | 1/2008 | Yang | ................. H01L 27/14618 257/432 |
| 2010/0087024 A1* | 4/2010 | Hawat | ................... B81B 7/0077 438/51 |
| 2010/0221860 A1* | 9/2010 | Hawat | ................... B81B 7/0074 438/51 |
| 2015/0256725 A1* | 9/2015 | Jiang | .................... H04N 5/2253 348/373 |

\* cited by examiner

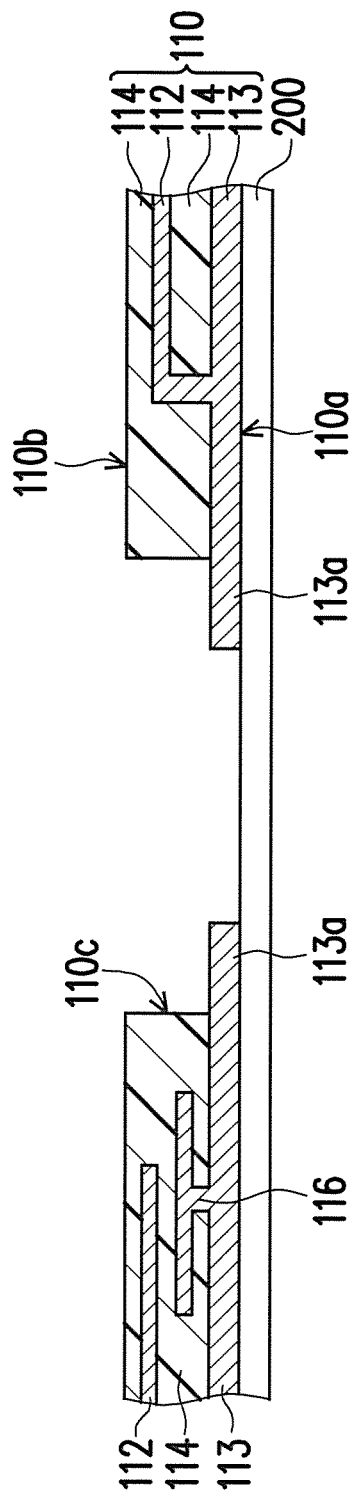
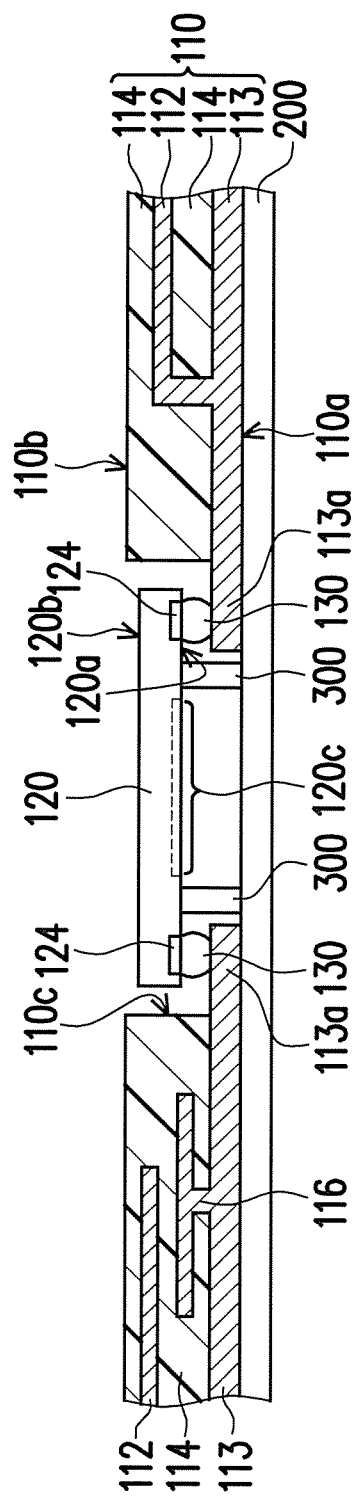
FIG. 1A
FIG. 1B

PROCESS OF AN EMBEDDED COMPONENT STRUCTURE

CROSS-REFERENCE TO RELATED APPLICATION

This application is a divisional application of and claims the priority benefit of U.S. application Ser. No. 14/255,971, filed on Apr. 18, 2014, now allowed. The entirety of the above-mentioned patent application is hereby incorporated by reference herein and made a part of this specification.

FIELD OF THE DISCLOSURE

The disclosure relates to an embedded component structure and process thereof.

DESCRIPTION OF RELATED ART

With recent progress of electronic technologies, electronic products that are more user-friendly and with better performance are continuously developed. Further, these products are designed to satisfy requirements for lightness, slimness, shortness, and compactness. In order to reduce the area of the wiring board on which electronic components are disposed or other requirements, a wiring board having an embedded component may be disposed in these products. Currently in the wiring board having an embedded component is provided, the component is embedded during the fabricating process of the wiring board. However, when the component is embedded, the fabricating process of the wiring board may cause reducing the process yield.

SUMMARY OF THE DISCLOSURE

The disclosure relates to an embedded component structure, used for increasing the process yield during the fabricating process.

The disclosure relates to a process of an embedded component structure, used for increasing the process yield during the fabricating process.

The disclosure provides an embedded component structure including a wiring board, a component, and an encapsulant. The wiring board includes a front side, a reverse side opposite to the front side, an opening and an interconnection layer. The opening passes through the wiring board and connects the front side and the reverse side of the wiring board. The interconnection layer is located on the front side of the wiring board and extends toward the opening. The component has an active surface, a back surface opposite to the active surface, and a working area located on the active surface. The active surface is bonded to the interconnection layer, the component is located in the opening, and the active surface and the front side of the wiring board face in a same direction. The encapsulant is filled inside the opening and covers the component, and exposes the working area.

The disclosure further provides a process of an embedded component structure including the following steps. A wiring board is provided, wherein electrical function of the wiring board is normal, the wiring board has a front side, a reverse side opposite to the front side, an opening and an interconnection layer, the opening penetrates the wiring board and connects the front side and the reverse side, and the interconnection layer is located on the front side and extends toward the opening. A component is bonded to the wiring board, wherein electrical function of the component is normal, the component has an active surface, a back surface opposite to the active surface, and a working area located on the active surface, the active surface is bonded to the interconnection layer, the component is located in the opening, and the active surface and the front side of the wiring board face in a same direction; and An encapsulant is filled into the opening, so as to cover the component and expose the working area.

In light of the above, in the disclosure, the component whose electrical function is normal is bonded to the wiring board whose electrical function is normal, the component is located at the opening of the wiring board, and an encapsulant is filled into the opening. As such, the process of the embedded component structure is completed. Thus, the process yield of the embedded component structure is increased.

To make the above features and advantages of the present invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1A through FIG. 1D schematically illustrate the steps of a process for fabricating an embedded component structure according to one embodiment of the disclosure.

DESCRIPTION OF EMBODIMENTS

Figure 1C:
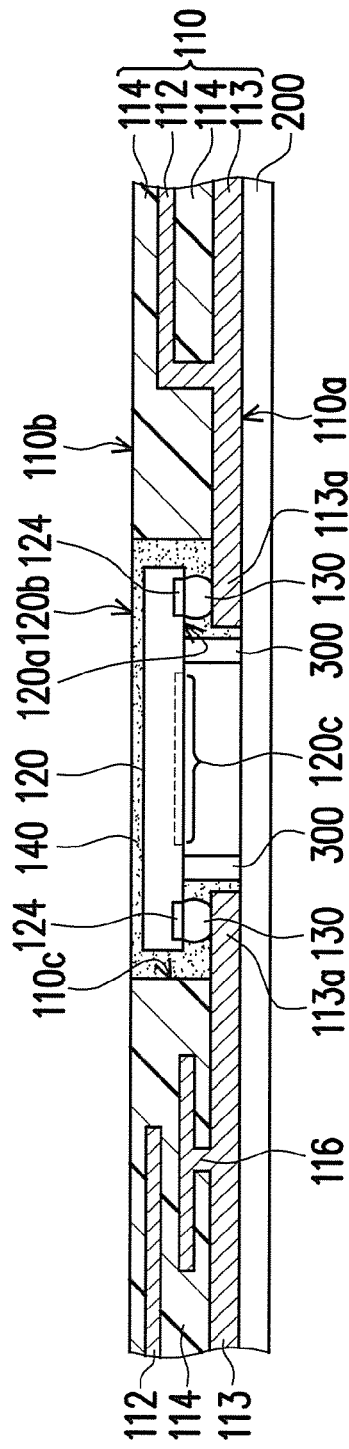

FIG. 1A through FIG. 1D schematically illustrate the steps of a process for fabricating an embedded component structure according to one embodiment of the disclosure. First, as shown in FIG. 1A, a wiring board 110 with normal electrical function is provided. In the embodiment, the wiring board 110 may be installed on a supporting board 200 in advance, so as to provide a sufficient supporting strength in proceeding fabricating steps, but the disclosure is not limited thereto. In the embodiment, the wiring board 110 has a front side 110a, a reverse side 110b opposite to the front side 110a, an opening 110c and an interconnection layer 113, wherein the opening 110c penetrates the wiring board 110 and connects the front side 110a and the reverse side 110b, and the interconnection layer 113 is located on the front side 110a and extends toward the opening 110c. The wiring board 110 may include a plurality of patterned conductive layers 112, a plurality of dielectric layers 114, and a plurality of conductive vias 116. The patterned conductive layers 112 and the dielectric layers 114 are alternately laminated. Each of the conductive vias 116 passes through at least one of the dielectric layers 114, so that each of the conductive vias 116 connects at least two of the patterned conductive layers 112. The patterned conductive layer 112 located on the front side 110a of the wiring board 110 is viewed as the interconnection layer 113 of the wiring board 110. The thickness of the interconnection layer 113 may be larger than the thickness of the other patterned conductive layers 112, so as to provide a sufficient supporting strength.

In the embodiment, the wiring board 110 may be formed by the two following methods, but the disclosure is not limited to this. For example, after a plurality of patterned conductive layers 112 (except the interconnection layer 113), a plurality of dielectric layers 114 and a plurality of conductive vias 116 are formed, the interconnection layer 113 is attached to the bottom most dielectric layer 114 and connected to the corresponding conductive vias 116. Or, for example, after the interconnection layer 113, a plurality of patterned conductive layers 112, a plurality of dielectric layers 114 and a plurality of conductive vias 116 are formed, by using mechanical drilling method, laser drilling method, or the like, a part of dielectric layer 114 and the interconnection layer 113 are removed, and the opening 110c of the wiring board 110 is formed.

Next, as shown in FIG. 1B, a component 120 with normal electrical function is bonded to the wiring board 110. The component 120 has an active surface 120a, a back surface 120b opposite to the active surface 120a, and a working area 120c located on the active surface 120a. In the embodiment, the interconnection layer 113 of the wiring board 110 has a plurality of leads 113a extending toward to the opening 110c, and the component 120 has a plurality of bonding pads 124 located on the active surface 120a. The bonding pads 124 are bonded to the leads 113a through a plurality of conductive bumps 130 (e.g., gold bumps) respectively. Therefore, the active surface 120a of the component 120 is bonded to the interconnection layer 113 of the wiring board 110, the component 120 is located in the opening 110c, and the active surface 120a of the component 120 and the front side 110a of the wiring board 110 face in a same direction. In the embodiment, the component 120 may be an active component, such as an optical sensor chip, an acoustic sensor chip, or the like, but the disclosure is not limited thereto. Further, the working area 120c of the component 120 may be an optical sensing area and an acoustic sensing area. In detailed, if the working area 120c of the component 120 is an optical sensing area, then one or more optical sensing units may be disposed in the working area 120c, so as to detect light. If the working area 120c of the component 120 is an acoustic sensing area, then one or more acoustic sensing units may be disposed in the working area 120c, so as to detect sound.

Next, please refer to FIG. 1C. An encapsulant 140 is filled inside the opening 110c and covers the component 120, and exposes the working area 120c of the component 120. In the embodiment, in order to prevent that the encapsulant 140 flows into the working area 120c of the active surface 120a of the component 120, a stop layer 300 may be disposed around the working area 120c of the active surface 120a (as shown in FIG. 1C). The stop layer 300 may prevent the encapsulant 140 from flowing into the working area 120c, so as to maintain the normal operation of the working area 120c. In another embodiment which is not shown in the drawings, in order to prevent that the encapsulant 140 flows into the working area 120c of the active surface 120a of the component 120, a stop layer 300 may be disposed on the working area 120c to cover the working area 120c of the active surface 120a.

Figure 1D:
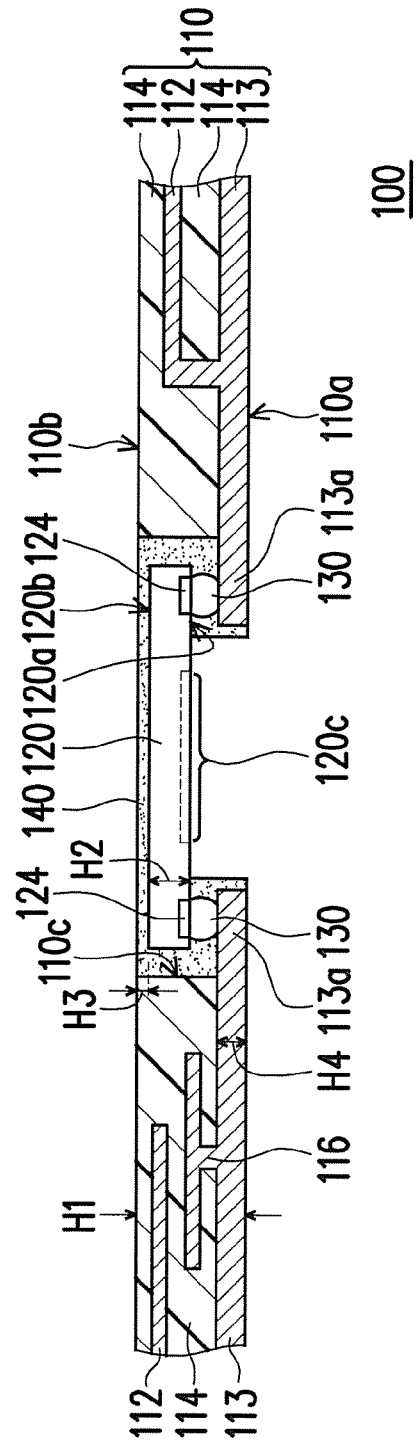

Then, as shown in FIG. 1D, the supporting board 200 and the stop layer 300 of FIG. 1C are removed, and the process of the embedded component structure 100 of the embodiment is completed. In another embodiment which is not shown in the drawings, the stop layer 300 may also be retained.

As shown in FIG. 1D, in the embodiment, the back surface 120b of the component 120 is lower than the reverse side 110b of the wiring board 110, and a portion of the encapsulant 140 located on the back surface 120b of the component 120 and the reverse side 110b of the wiring board 110 are substantially flush with each other. The wiring board 110 has a first thickness H1, the component 120 has a second thickness H2, a portion of the encapsulant 140 located on the back surface 120b of the component 120 has a third thickness H3, and the interconnection layer 113 has a fourth thickness H4. The sum of the second thickness H2, the third thickness H3 and the fourth thickness H4 is substantially equal to the first thickness H1.

Figure 2:
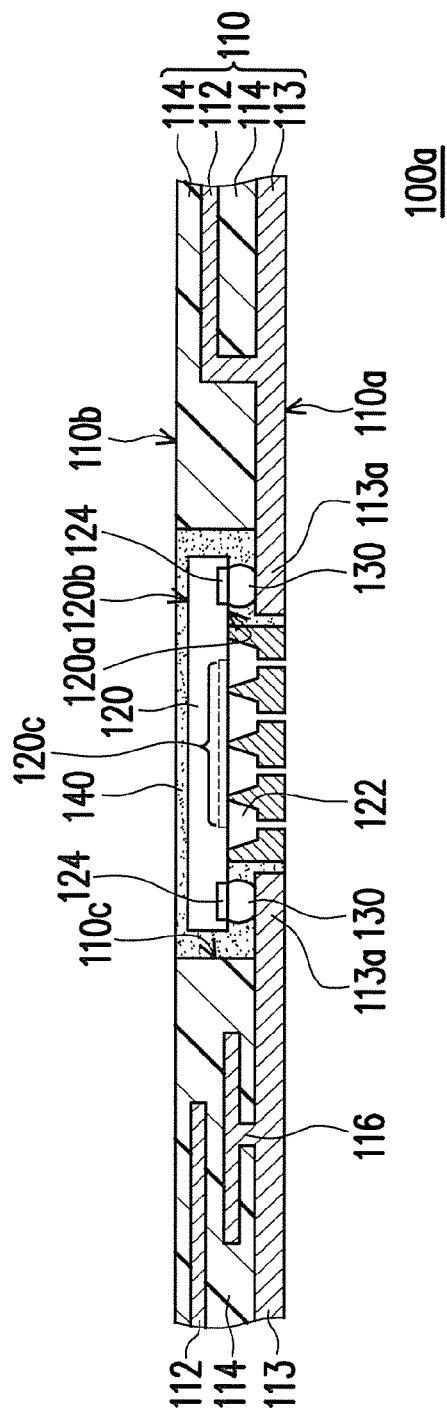
FIG. 2 is a schematic view of an embedded component structure according to another embodiment of the disclosure.

FIG. 2 is a schematic view of an embedded component structure according to another embodiment of the disclosure. Referring to FIG. 2, in the embodiment, the embedded component structure 100a and the embedded component structure 100 mentioned above is substantially the same; therefore, the following description is only related to the structural difference therebetween. In the embodiment, the component 120 may be an inkjet chip, thus a plurality of inkjet units 122 may be disposed on the active surface 120a of the component 120, so that the working area 120c of the component 120 is formed into an inkjet area. In detailed, the inkjet units 122 located on the active surface 120a of the component 120 may eject ink so as to perform printing function.

Figure 3:
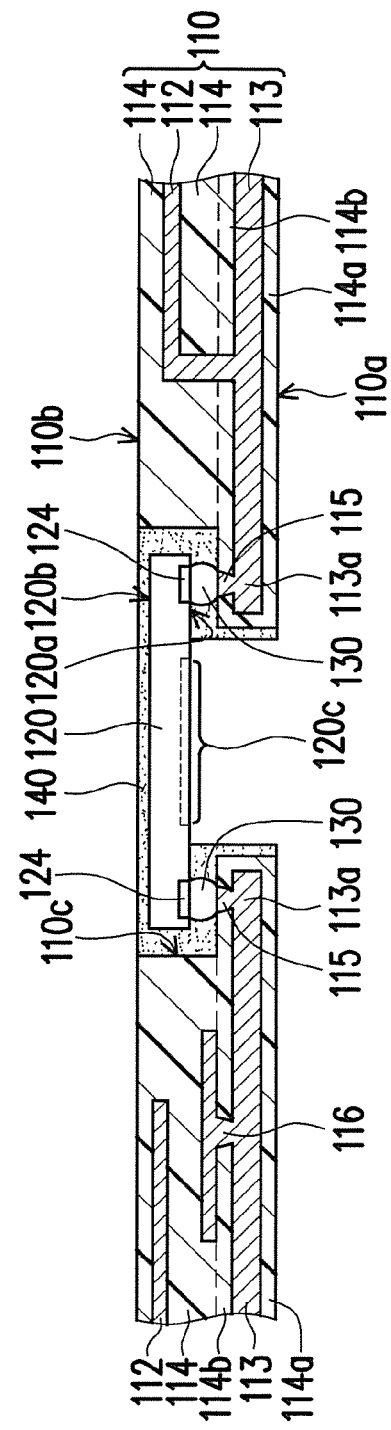
FIG. 3 is a schematic view of an embedded component structure according to still another embodiment of the disclosure.

FIG. 3 is a schematic view of an embedded component structure according to still another embodiment of the disclosure. Referring to FIG. 3, in the embodiment, the embedded component structure 100b and the embedded component structure 100 mentioned above is substantially the same so that the following description is only related to the structural difference therebetween. In the embodiment, a first dielectric layer 114a and a second dielectric layer 114b are disposed on two opposite sides of the interconnection layer 113 respectively, such that the interconnection layer 113 is located between the first dielectric layer 114a and the second dielectric layer 114b. In detailed, the second dielectric layer 114b extends toward the opening 110c to the bottom of the conductive bumps 130, and the wiring board 110 may further include a plurality of conductive vias 115 which pass through the second dielectric layer 114b, such that the conductive bumps 130 may connected to the leads 113a of the interconnection layer 113 through the conductive vias 115 respectively.

In light of the foregoing, in the disclosure, the component whose electrical function is normal is bonded to the wiring board whose electrical function is normal, the component is located at the opening of the wiring board, and an encapsulant is filled into the opening. As such, the process of the embedded component structure is completed. Thus, the process yield of the embedded component structure is increased.

Although the present invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A process of an embedded component structure, comprising:
   providing a wiring board, wherein electrical function of the wiring board is normal, the wiring board has a front side, a reverse side opposite to the front side, an opening and an interconnection layer, the opening penetrates the wiring board and connects the front side and the reverse side, and the interconnection layer is located on the front side and extends toward the opening;

bonding a component to the wiring board, wherein electrical function of the component is normal, the component has an active surface, a back surface opposite to the active surface, and a working area located on the active surface, the active surface is bonded to the interconnection layer, the component is located in the opening, and the active surface and the front side of the wiring board face in a same direction; and filling an encapsulant into the opening, so as to cover at least the back surface and a portion of the active surface of the component and expose the working area, wherein a portion of the encapsulant located on the back surface of the component is flush with the reverse side of the wiring board.

2. The process as claimed in claim 1, wherein the interconnection layer has a plurality of leads extending to the opening, the component has a plurality of bonding pads located on the active surface, and in the step that the active surface is bonded to the interconnection layer, the bonding pads are connected to the leads through a plurality of conductive bumps respectively.

3. The process as claimed in claim 1, further comprising:
before the step of bonding the component to the wiring board, installing the wiring board on a supporting board so as to provide a sufficient supporting strength; and
after the step of filling the encapsulant, removing the supporting board.

4. The process as claimed in claim 1, further comprising:
before the step of filling the encapsulant, disposing a stop layer around the working area of the active surface or on the working area of the active surface, so that the encapsulant flowing into the working area in the step of filling the encapsulant is prevented.

5. The process as claimed in claim 4, further comprising:
after the step of filling the encapsulant, removing the stop layer.

\* \* \* \* \*